United States Patent
Kim et al.

(10) Patent No.: US 10,199,499 B2
(45) Date of Patent: Feb. 5, 2019

(54) SEMICONDUCTOR DEVICE INCLUDING ACTIVE FIN

(71) Applicants: Sung-Min Kim, Incheon (KR); Dong-Ho Cha, Seongnam-si (KR); Sunhom Steve Paak, Seoul (KR)

(72) Inventors: Sung-Min Kim, Incheon (KR); Dong-Ho Cha, Seongnam-si (KR); Sunhom Steve Paak, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/060,265

(22) Filed: Mar. 3, 2016

(65) Prior Publication Data

US 2016/0276482 A1    Sep. 22, 2016

(30) Foreign Application Priority Data

Mar. 20, 2015    (KR) ......................... 10-2015-0038686

(51) Int. Cl.
| | | |
|---|---|---|
| *H01L 21/84* | (2006.01) | |
| *H01L 29/165* | (2006.01) | |
| *H01L 29/78* | (2006.01) | |
| *H01L 27/11* | (2006.01) | |
| *H01L 27/092* | (2006.01) | |
| *H01L 27/02* | (2006.01) | |

(52) U.S. Cl.
CPC ...... *H01L 29/7848* (2013.01); *H01L 27/0207* (2013.01); *H01L 27/0924* (2013.01); *H01L 27/1104* (2013.01); *H01L 27/1116* (2013.01); *H01L 29/165* (2013.01)

(58) Field of Classification Search
CPC ............. H01L 29/7848; H01L 27/1116; H01L 27/0924; H01L 27/1104; H01L 21/823431; H01L 21/823821; H01L 21/845; H01L 27/0886; H01L 27/0207; H01L 29/165
See application file for complete search history.

(56) References Cited

U.S. PATENT DOCUMENTS

| | | | |
|---|---|---|---|
| 7,560,785 | B2 | 7/2009 | Yu et al. |
| 7,612,420 | B2 | 11/2009 | Lenoble |
| 7,994,020 | B2 | 8/2011 | Lin et al. |
| 8,022,478 | B2 | 9/2011 | Anderson et al. |
| 8,431,466 | B2 | 4/2013 | Lin et al. |
| 8,460,984 | B2 | 6/2013 | Wahl et al. |
| 8,610,241 | B1 | 12/2013 | Hu et al. |
| 8,629,039 | B2 | 1/2014 | Rachmady et al. |

(Continued)

FOREIGN PATENT DOCUMENTS

| | | |
|---|---|---|
| JP | 2008053729 A | 3/2008 |
| KR | 20110049806 A | 5/2011 |

(Continued)

*Primary Examiner* — Bitew A Dinke
(74) *Attorney, Agent, or Firm* — Myers Bigel, P.A.

(57) ABSTRACT

A semiconductor device includes first through fourth active fins, which extend alongside one another in a first direction; and a field insulating film that covers lower portions of the first through fourth active fins, the first and second active fins protrude from the field insulating film at a first height, the third active fin protrudes from the field insulating film at a second height different from the first height, and an interval between the first and second active fins is different from an interval between the third and fourth active fins.

19 Claims, 19 Drawing Sheets

(56) References Cited

U.S. PATENT DOCUMENTS

| | | | |
|---|---|---|---|
| 8,697,515 B2 | 4/2014 | Yin et al. | |
| 8,896,067 B2 | 11/2014 | Bergendahl et al. | |
| 8,946,038 B2 | 2/2015 | Hu et al. | |
| 2007/0069293 A1* | 3/2007 | Kavalieros | H01L 21/823431 257/350 |
| 2011/0147848 A1* | 6/2011 | Kuhn | H01L 21/76229 257/368 |
| 2012/0001197 A1* | 1/2012 | Liaw | H01L 27/11 257/77 |
| 2012/0032267 A1 | 2/2012 | Cheng et al. | |
| 2013/0141962 A1* | 6/2013 | Liaw | G11C 11/412 365/154 |
| 2013/0143372 A1* | 6/2013 | Kim | H01L 21/3081 438/163 |
| 2013/0154027 A1* | 6/2013 | Liaw | H01L 27/1104 257/390 |
| 2013/0181297 A1* | 7/2013 | Liaw | G11C 11/412 257/390 |
| 2013/0221491 A1 | 8/2013 | Wann et al. | |
| 2013/0244392 A1* | 9/2013 | Oh | H01L 29/66477 438/299 |
| 2013/0292777 A1* | 11/2013 | Liaw | G11C 11/412 257/369 |
| 2014/0008730 A1* | 1/2014 | Mitard | H01L 27/092 257/369 |
| 2014/0065802 A1* | 3/2014 | Chang | H01L 21/845 438/479 |
| 2014/0131813 A1* | 5/2014 | Liaw | H01L 27/1104 257/401 |
| 2014/0151812 A1* | 6/2014 | Liaw | H01L 21/76895 257/368 |
| 2014/0153322 A1* | 6/2014 | Liaw | G11C 11/412 365/156 |
| 2014/0284723 A1* | 9/2014 | Lee | H01L 21/76 257/369 |
| 2014/0291770 A1 | 10/2014 | Yin et al. | |
| 2014/0306317 A1* | 10/2014 | Licausi | H01L 21/30625 257/506 |
| 2014/0327074 A1* | 11/2014 | Tsao | H01L 27/0886 257/337 |
| 2015/0187634 A1* | 7/2015 | Chiang | H01L 21/2636 257/401 |
| 2015/0380078 A1* | 12/2015 | Liaw | G11C 11/419 365/156 |
| 2016/0071932 A1* | 3/2016 | Sung | H01L 29/1033 257/369 |
| 2016/0141288 A1* | 5/2016 | Weng | H01L 21/8258 257/192 |

FOREIGN PATENT DOCUMENTS

| | | |
|---|---|---|
| KR | 10-1388329 B1 | 4/2014 |
| KR | 10-1434089 B1 | 8/2014 |

* cited by examiner

1200

1400

SEMICONDUCTOR DEVICE INCLUDING ACTIVE FIN

CROSS-REFERENCE TO RELATED APPLICATION

This application claims priority under 35 U.S.C § 119 to Korean Patent Application No. 10-2015-0038686 filed on Mar. 20, 2015, the disclosure of which is incorporated herein by reference in its entirety.

BACKGROUND

1. Field of the Disclosure

The present disclosure relates to a semiconductor device including an active fin.

2. Description of the Related Art

A multi-gate transistor has been suggested as one possible scaling technique for increasing the density of a semiconductor device in which a multi-channel active pattern (or a silicon body) having a fin or nanowire shape is formed on a substrate and a gate is formed on a surface of the multi-channel active pattern.

Because such a multi-gate transistor uses three-dimensional channels, it is generally easy to perform the scaling. Further, even if a gate length of the multi-gate transistor is not increased, it is possible to improve the current control capability. Furthermore, it is possible to effectively suppress a short channel effect (SCE) in which the potential of the channel region is influenced by the drain voltage.

SUMMARY

According to an aspect of the present disclosure, there is provided a semiconductor device comprising first through fourth active fins, which extend alongside one another in a first direction; and a field insulating film that covers lower portions of the first through fourth active fins, wherein the first and second active fins protrude from the field insulating film at a first height, wherein the third active fin protrudes from the field insulating film at a second height different from the first height, and wherein an interval between the first and second active fins is different from an interval between the third and fourth active fins.

According to another aspect of the present disclosure, there is provided a semiconductor device comprising a first node configured to receive a first voltage, a second node configured to receive a second voltage different from the first voltage and a pull-up transistor and a pull-down transistor which are connected in series between the first node and the second node, wherein the pull-down transistor comprises a first active fin, which protrudes from the field insulating film at a first height and extends in a first direction, and a first gate electrode, which extends in a second direction intersecting with the first direction and is disposed on the first active fin, and the pull-up transistor comprises a second active fin, which protrudes from the field insulating film at a second height different from the first height and extends in the first direction, and a second gate electrode, which extends in the second direction and is disposed on the second active fin.

According to another aspect of the present disclosure, there is provided a semiconductor device comprising a substrate comprising a first region and a second region, first and second active fins that extend alongside each other in a first direction in the first region, third and fourth active fins that are formed alongside each other in the first direction in the second region and a gate electrode that extends in a second direction intersecting with the first direction, wherein the first and second active fins comprise a first compound semiconductor layer, and a second compound semiconductor layer that is disposed on the first compound semiconductor layer and is different from the first compound semiconductor layer, the third and fourth active fins comprise the first compound semiconductor layer, and a third compound semiconductor layer that is disposed on the first compound semiconductor layer and is different from the first and second compound semiconductor layers, and a first interval between the first and second active fins is different from a second interval between the third and fourth active fins.

According to another aspect of the present disclosure, there is provided a semiconductor device comprising a substrate comprising a first region and a second region, first and second active fins that extend alongside each other in a first direction in the first region, third and fourth active fins that are formed alongside each other in the first direction in the second region, a field insulating film that covers lower portions of the first through fourth active fins and a gate electrode that extends in a second direction intersecting with the first direction, wherein the first and second active fins comprise a first compound semiconductor layer, and a second compound semiconductor layer that is disposed on the first compound semiconductor layer and is different from the first compound semiconductor layer, the third and fourth active fins comprise the first compound semiconductor layer, and a third compound semiconductor layer that is disposed on the first compound semiconductor layer and is different from the first and second compound semiconductor layers, and a first height of the first and second active fins protruding from the field insulating film is different from a second height of the third and fourth active fins protruding from the field insulating film.

Other methods, systems, and/or devices according to embodiments of the inventive concept will be or become apparent to one with skill in the art upon review of the following drawings and detailed description. It is intended that all such additional methods, systems, and/or devices be included within this description, be within the scope of the present inventive concepts, and be protected by the accompanying claims. Moreover, it is intended that all embodiments disclosed herein can be implemented separately or combined in any way and/or combination.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
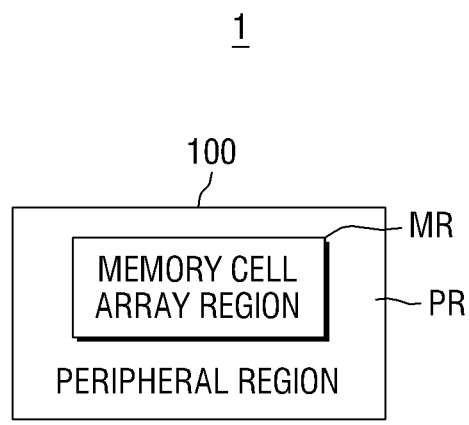
FIG. 1 is a conceptual view of a semiconductor device according to an embodiment of the present disclosure.

Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. In the drawings, the thickness of layers and regions are exaggerated for clarity.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
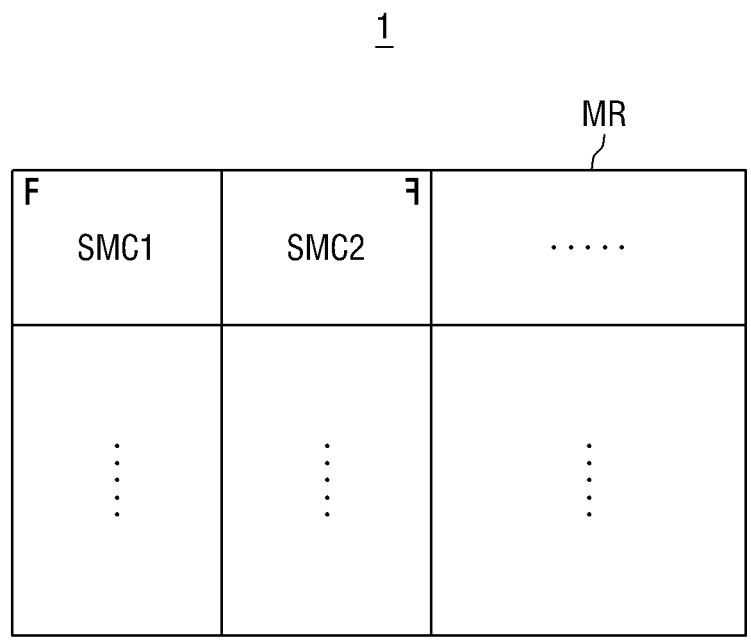
FIG. 2 is a conceptual view of a memory cell array region of FIG. 1.

FIG. 1 is a conceptual view of a semiconductor device according to an embodiment of the inventive concept. FIG. 2 is a conceptual view of a memory cell array region of FIG. 1.

Referring to FIG. 1, a semiconductor device 1 can include a memory cell array region MR and a peripheral circuit region PR. Specifically, the memory cell array region MR and the peripheral circuit region PR can be disposed on a substrate 100 of the semiconductor device 1.

A memory element can be disposed in the memory cell array region MR. Examples of such a memory element can include SRAM (Static Random Access Memory), DRAM (Dynamic Random Access Memory), NAND or NOR flash memory, MRAM (Magnetic Random Access Memory), PRAM (Phase Change Random Memory), RRAM (Resistive Random Access Memory) or the like, but embodiments of the inventive concept are not limited thereto.

Elements required for driving the memory elements disposed in the memory cell array region MR can be disposed in the peripheral circuit region PR. Examples of such an element can include an input/output buffer (I/O buffer), a read circuit, a write circuit or the like, but embodiments of the inventive concept are not limited thereto.

Referring to FIG. 2, the memory cell array region MR can include a plurality of memory cell regions.

An example in which the SRAM elements are disposed in each memory cell region of the memory cell array region MR will be described below, but embodiments of the inventive concept are not limited thereto. That is, an example in which the memory cell array region MR includes a plurality of SRAM memory cell regions SMC1, SMC2 will be described below, but embodiments of the inventive concept are not limited thereto.

As illustrated, the plurality of SRAM memory cell regions SMC1, SMC2 can be disposed by being arranged in a grid shape and have an array form. SRAM cells can be disposed in each of the SRAM memory cell regions SMC1, SMC2.

The SRAM cells will be described in more detail below with reference to FIGS. 3 to 7.

Figure 3:
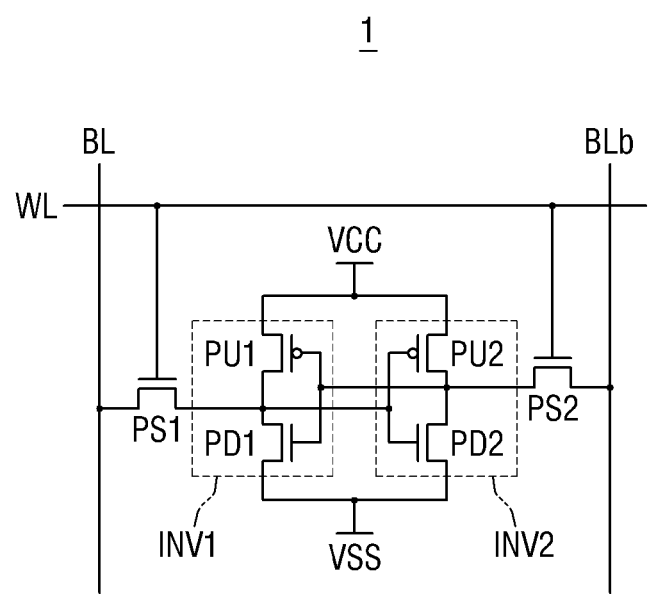
FIG. 3 is a circuit diagram of a SRAM memory cell region of FIG. 2.
Figure 4:
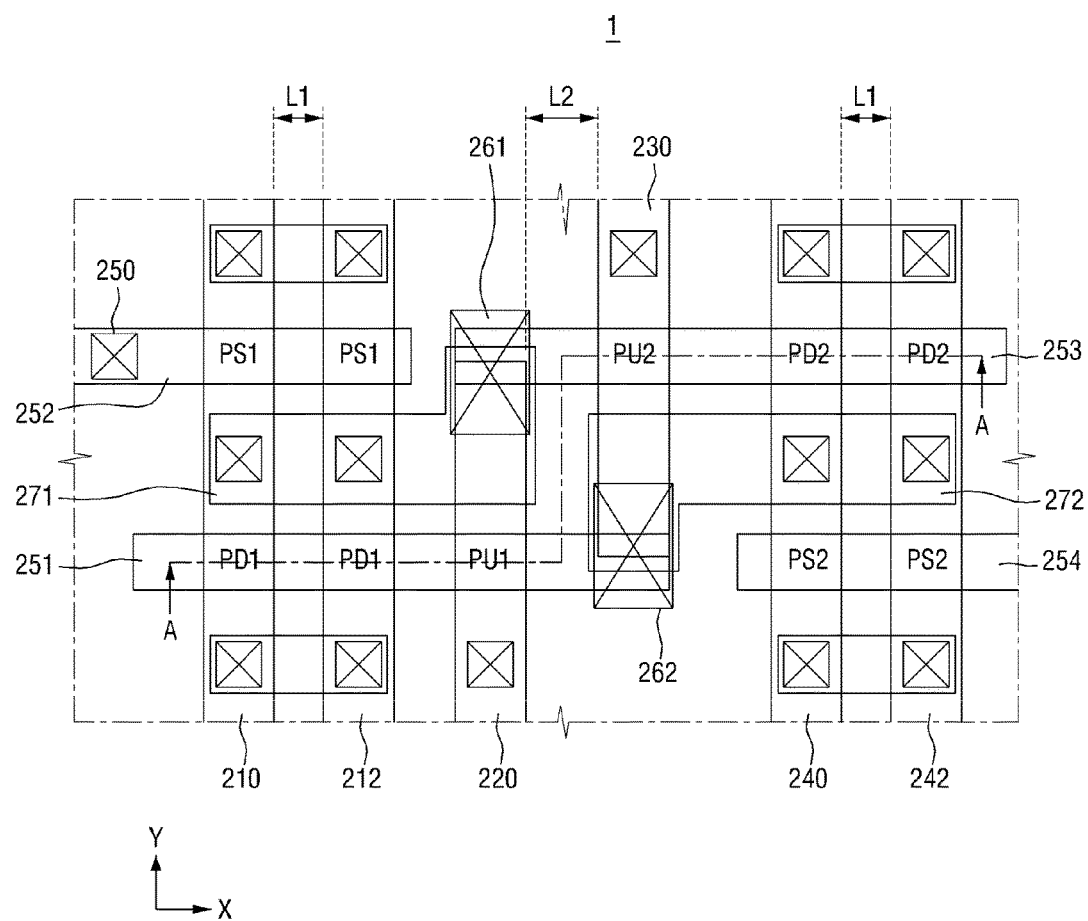
FIG. 4 is a layout diagram of the SRAM memory cell region of FIG. 2.
Figure 5:
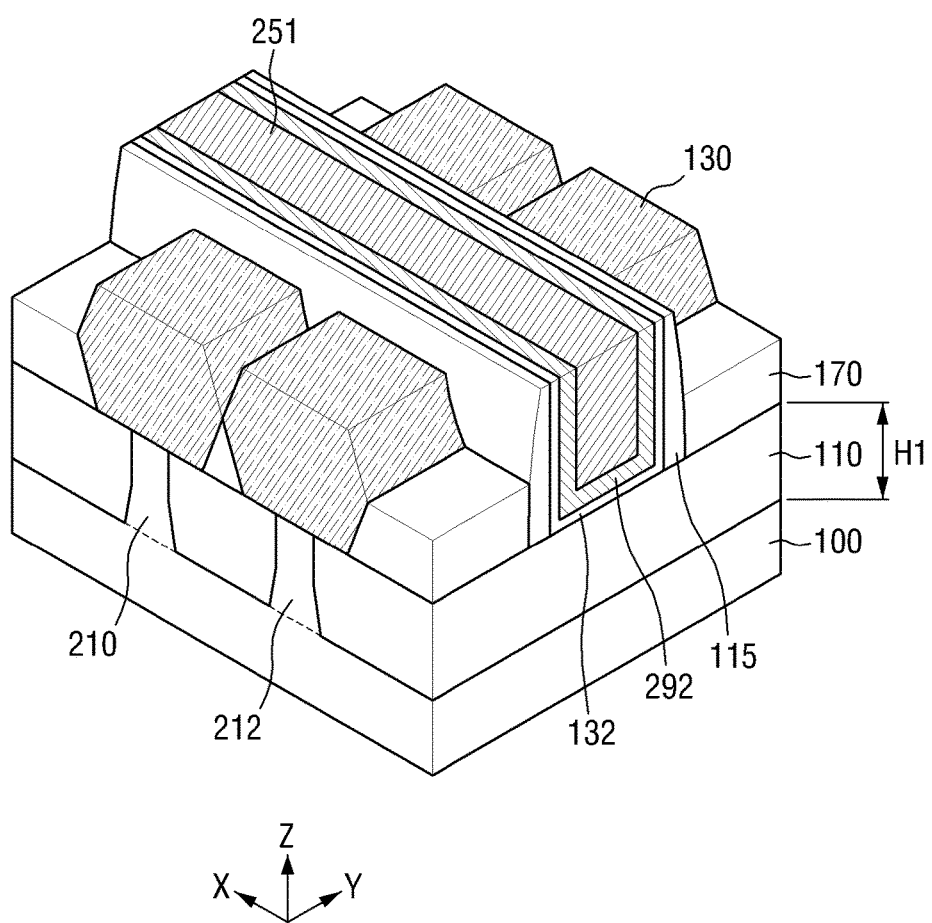
FIG. 5 is a perspective view illustrating a pull-down transistor of FIG. 4.
Figure 6A:
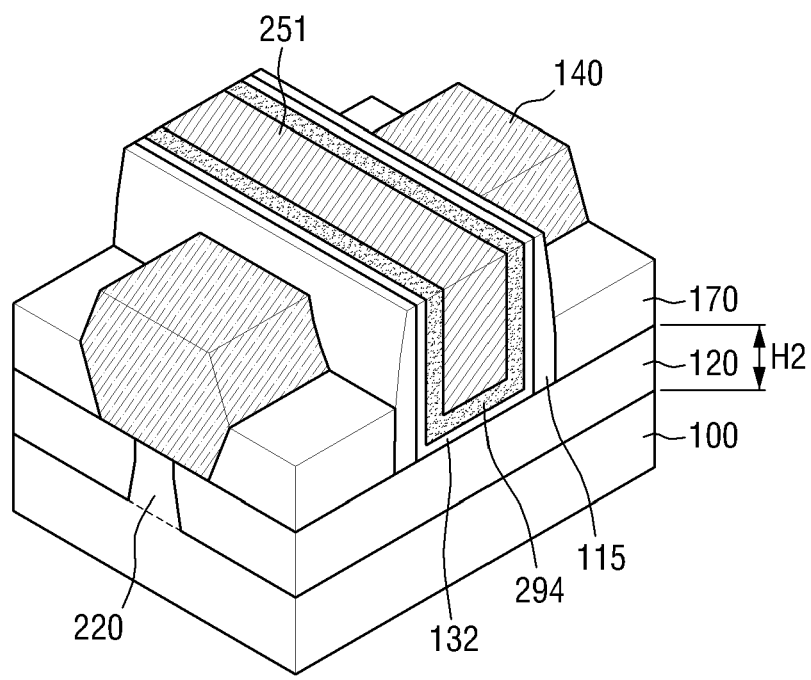
FIG. 6A is a perspective view illustrating a pull-up transistor of FIG. 4.
Figure 6B:
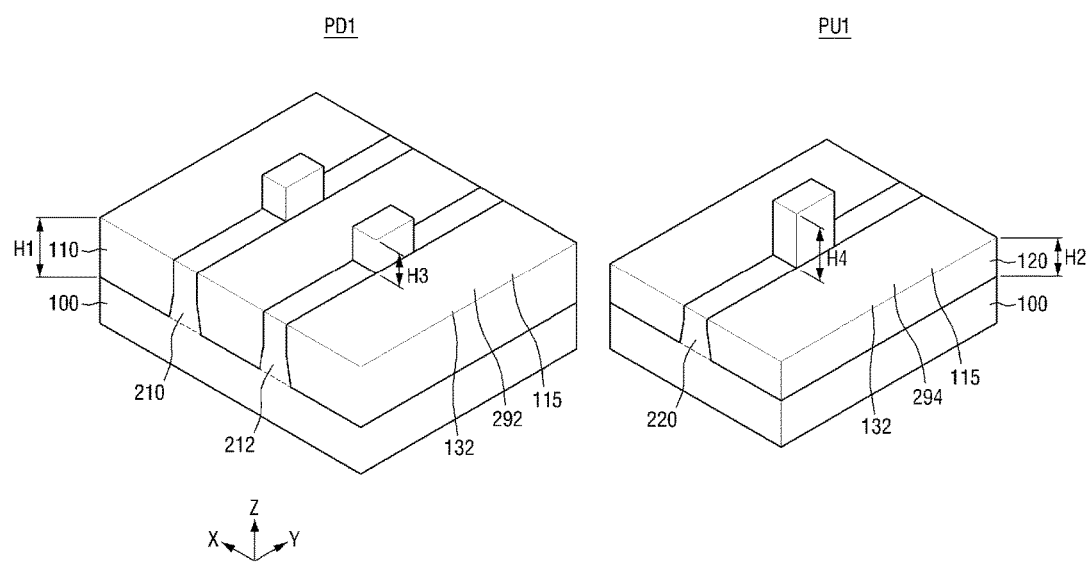
FIG. 6B includes diagrams for comparing the pull-down transistor illustrated in FIG. 5 to the pull-up transistor illustrated in FIG. 6A.
Figure 7:
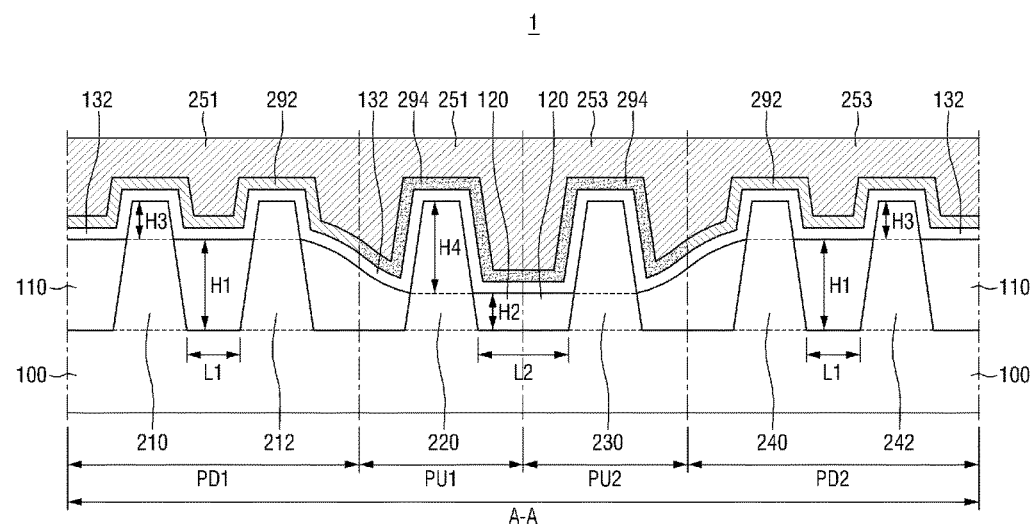
FIG. 7 is a cross-sectional view taken along a line A-A of FIG. 4.

FIG. 3 is a circuit diagram of the SRAM memory cell region of FIG. 2. FIG. 4 is a layout diagram of the SRAM memory cell region of FIG. 4. FIG. 5 is a perspective view illustrating a pull-down transistor of FIG. 4. FIG. 6A is a perspective view illustrating a pull-up transistor of FIG. 4. FIG. 6B provides diagrams for comparing the pull-down transistor illustrated in FIG. 5 to the pull-up transistor illustrated in FIG. 6A. FIG. 7 is a cross-sectional view taken along a line A-A of FIG. 4.

First, referring to FIG. 3, the semiconductor device 1 can include a pair of inverters INV1, INV2 connected in parallel between a power supply node VCC and a ground node VSS, and a first pass transistor PS1 and a second pass transistor PS2 connected to output nodes of each of the inverters INV1, INV2.

The first pass transistor PS1 and the second pass transistor PS2 can be connected to a bit line BL and a complementary bit line BLb, respectively. The gates of the first pass transistor PS1 and the second pass transistor PS2 can be connected to a word line WL.

A first inverter INV1 can include a first pull-up transistor PU1 and a first pull-down transistor PD1 that are connected in series between the power supply node Vcc and the ground node VSS, and a second inverter INV2 can include a second pull-up transistor PU2 and a second pull-down transistor PD2 that are connected in series between the power supply node Vcc and the ground node VSS.

In an embodiment, the first pull-up transistor PU1 and the second pull-up transistor PU2 can be a PFET transistor, and the first pull-down transistor PD1 and the second pull-down transistor PD2 can be an NFET transistor.

Further, an input node of the first inverter INV1 can be connected to an output node of the second inverter INV2 and an input node of the second inverter INV2 can be connected to an output node of the first inverter INV1 so that the first inverter INV1 and the second inverter INV2 constitute a single latch circuit.

Referring now to FIGS. 3 to 7, a first active fin 210, a second active fin 212, a third active fin 220, a fourth active fin 230, a fifth active fin 240 and a sixth active fin 242 spaced apart from each other in a first direction X can extend lengthwise in a second direction Y.

In some embodiments, as illustrated, the extended lengths of the third active fin 220 and the fourth active fin 230 can be shorter than those of the remaining active fins 210, 212, 240, 242.

The first active fin 210 and the second active fin 212 can be spaced apart from each other by a first interval L1. Moreover, the fifth active fin 240 and the sixth active fin 242 can be spaced apart from each other by the first interval L1.

The third active fin 220 and the fourth active fin 230 can be spaced apart from each other by a second interval L2. Here, the second interval L2 can be larger than the first interval L1. That is, the first interval L1 can be smaller than the second interval L2.

Thus, the first and second active fins 210, 212 can be disposed adjacent to each other as compared to the third and fourth active fins 220, 230, and the fifth and sixth active fins 240, 242 can be disposed adjacent to each other as compared to the third and fourth active fins 220, 230.

A first gate, a second gate electrode 252, a third gate electrode 253, and a fourth gate electrode 254 can extend lengthwise in the first direction X.

The first gate electrode 251 can be spaced apart from the fourth gate electrode 254 in the first direction X and can be spaced apart from the second and third gate electrodes 252, 253 in the second direction Y. The second gate electrode 252 can be spaced apart from the third gate electrode 253 in the first direction X and can be spaced apart from the first and fourth gate electrodes 251, 254 in the second direction Y.

The first gate electrode 251 can intersect the first through fourth active fins 210, 212, 220, 230. The second gate electrode 252 can intersect the first and second active fins 210, 212. The third gate electrode 253 can intersect the third through sixth active fins 220, 230, 240, 242. The fourth gate electrode 254 can intersect the fifth and sixth active fins 240, 242.

Specifically, the first gate electrode 251 can completely intersect the first through third active fins 210, 212, 220 and can partially overlap a terminal end of the fourth active fin 230. The third gate electrode 253 can completely intersect the fourth through sixth active fins 230, 240, 242 and can partially overlap a terminal end of the third active fin 220.

As illustrated, the first pull-down transistor PD1 can be defined in a region in which the first gate electrode 251 intersects the first and second active fins 210, 212.

The first pull-down transistor PD1 can include the first and second active fins 210, 212, the first gate electrode 251, a first work function adjustment layer 292, a gate insulating film 132, a spacer 115 and a first impurity epitaxial layer 130.

The first and second active fins 210, 212 can project from the substrate 100 in a third direction Z to extend in the second direction Y.

In some embodiments, the substrate 100 can include a semiconductor material. The semiconductor material can be made up of one or more materials selected from a group that consists of, for example, Si, Ge, SiGe, GaP, GaAs, SiC, SiGeC, InAs and InP.

However, embodiments of the inventive concept are not limited to these examples, and in some other embodiments, the substrate 100 may be an insulating substrate. That is, the substrate 100, for example, can be a SOI (silicon on insulator) substrate. If the substrate 100 is a SOI in this way, a response speed of the semiconductor device can be improved.

Each of the first and second active fins 210, 212 can have a long side and a short side.

In FIG. 4, the long side direction of the first and second active fins 210, 212 is illustrated as the second direction Y, and the short side direction of the first and second active fins 210, 212 is illustrated as the first direction X, but embodiments of the inventive concept are not limited thereto.

In some other embodiments, the long side direction of the first and second active fins 210, 212 may be the first direction X, and the short side direction of the first and second active fins 210, 212 may be the second direction Y.

The first and second active fins 210, 212 may be a part of the substrate 100 and may include an epitaxial layer that is grown from the substrate 100.

In some embodiments, the first and second active fins 210, 212 can contain a semiconductor material. In this case, the first and second active fins 210, 212, for example, can contain Si, SiGe or the like.

In some embodiments, the first and second active fins 210, 212 can contain the same material as the substrate 100. For example, when the substrate 100 contains Si, the first and second active fins 210, 212 can also contain Si.

However, embodiments of the inventive concept are not limited thereto, and the substrate 100 and the first and second active fins 210, 212 may contain materials different from each other.

For example, when the substrate 100 contains Si, the first and second active fins 210, 212 can contain semiconductor materials different from Si. In this case, the first and second active fins 210, 212, for example, can be formed on the substrate 100 through an epitaxial growth process.

A first field insulating film 110 can be formed on the substrate 100 to cover a part of the side walls of the first and second active fins 210, 212 and expose the upper portions of the first and second active fins 210, 212. That is, as illustrated, the first field insulating film 110 can cover the lower portions of the first and second active fins 210, 212.

The first field insulating films 110 can be formed at a first height H1. Thus, the first and second active fins 210, 212 can protrude upward from the first field insulating films 110 by a third height H3.

In some embodiments, the first field insulating films 110, for example, contain one of an oxide film, an oxynitride film or a nitride film, but embodiments of the inventive concept are not limited thereto.

The gate insulating film 132, the first work function adjustment layer 292 and the first gate electrode 251 intersecting with the first and second active fins 210, 212 can be disposed on the first and second active fins 210, 212.

As illustrated in FIG. 5, the gate insulating film 132 can be formed on the upper surfaces of the first and second active fins 210, 212 and can be formed as a shape protruding from the substrate 100 along the sidewalls of the spacer 115. In other words, at least one end of the gate insulating film 132 can extend upward from the substrate 100.

Such a shape of the gate insulating film 132 can be provided because the first pull-down transistor PD1 of this embodiment, for example, is formed through a gate replacement process.

Further, as illustrated in FIG. 7, the gate insulating film 132 can be formed along the upper surface of the first field insulating film 110 and the side surfaces and the upper surfaces of the first and second active fins 210, 212.

The gate insulating film 132 can contain a high dielectric material having a dielectric constant greater than the silicon oxide film. For example, the gate insulating film 132 can contain $HfO_2$, $ZrO_2$, LaO, $Al_2O_3$, $Ta_2O_5$ or the like, but embodiments of the inventive concept are not limited thereto.

The first work function adjustment layer 292 can be formed on the gate insulating film 132. The first work function adjustment layer 292 can serve to regulate the work function of the first pull-down transistor PD1, and the first gate electrode 251 can serve to transmit the gate voltage applied from the outside. Further, the first gate electrode 251 can serve to fill the space formed by the first work function adjustment layer 292.

In some embodiments, the first work function adjustment layer 292 can contain a first metal, and the first gate electrode 251 can contain a second metal.

As illustrated in FIG. 5, the first work function adjustment layer 292 can be formed in a shape that extends upward along the upper surface of the gate insulating film 132 and the side surface of the first gate electrode 251. Such a shape of the first work function adjustment layer 292 can be provided because the first pull-down transistor PD1 of the present embodiment, for example, is formed through a gate replacement process.

Further, as illustrated in FIG. 7, the first work function adjustment layer 292 can be placed conformally along the upper portion of the first field insulating films 110, and the side walls and the upper portions of the first and second active fins 210, 212.

The first work function adjustment layer 292, for example, can include an N-type work function adjustment layer. The first work function adjustment layer 292, for example, can contain at least one of TiN, TaN, TiC, TiAlC and TaC.

The first gate electrode 251, for example, can contain W or Al. However, embodiments of the inventive concept are not limited thereto, and the configurations of the first work function adjustment layer 292 and the first gate electrode 251 may be otherwise modified.

In some other embodiments, the first gate electrode 251, for example, may contain Si, SiGe or the like rather than a metal.

The spacer 115 can be formed on at least one side of the first gate electrode 251. In some embodiments of the inventive concept, the spacer 115 can be formed on both sides of the first gate electrode 251.

Although the columnar spacer 115 is illustrated in the drawings, embodiments of the inventive concept are not limited thereto. In some other embodiments, the shape of the spacer 115 can be otherwise modified in any way.

In this embodiment, the spacer 115, for example, can include a nitride film. Specifically, the spacer 115 can include a silicon nitride film. However, embodiments of the inventive concept are not limited thereto, and the material constituting the spacer 115 can be modified in any way. For example, in some other embodiments, the spacer 115 can include any one of the oxide film or the oxynitride film.

A first impurity epitaxial layer 130 can be formed in the first and second active fins 210, 212 on both sides of the spacer 115.

In some embodiments, the first impurity epitaxial layer 130 can be formed in a region in which the first and second active fins 210, 212 are partially etched. The first impurity epitaxial layer 130, for example, can be formed on the first and second active fins 210, 212 through the epitaxial growth process.

In some embodiments, the first impurity epitaxial layer 130 can be an elevated source or drain region. That is, the upper surface of the first impurity epitaxial layer 130 can be higher than the upper surfaces of the first and second active fins 210, 212.

The first impurity epitaxial layer 130 can contain a semiconductor material. In some embodiments, the first impurity epitaxial layer 130, for example, can contain Si, but embodiments of the inventive concept are not limited thereto.

In some embodiments, the first impurity epitaxial layer 130 can contain the same material as the substrate 100 or a tensile stress material. For example, when the substrate 100 contains Si, the first impurity epitaxial layer 130 can contain Si or a material (e.g., SiC, SiP) having a lattice constant smaller than Si.

The tensile stress material can improve the mobility of carriers in the channel region by applying the tensile stress to the channel region defined in the first and second active fins 210, 212.

Although not completely illustrated in the drawings, the first impurity epitaxial layer 130 and the first gate electrode 251 can be covered with an interlayer insulating film 170.

Referring to FIG. 4 again, the first pull-up transistor PU1 can be defined in a region in which the first gate electrode 251 intersects with the third active fin 220.

The first pull-up transistor PU1 can include the third active fin 220, the first gate electrode 251, the second work function adjustment layer 294, the gate insulating film 132, the spacer 115 and the second impurity epitaxial layer 140.

Because the third active fin 220, the first gate electrode 251, the gate insulating film 132 and the spacer 115 are substantially the same as the previously described configurations, the description will not be repeated.

The second work function adjustment layer 294 can serve to adjust the work function of the first pull-up transistor PU1. In some embodiments, the second work function adjustment layer 294 can contain a third metal different from the first metal contained in the first work function adjustment layer 292.

The second work function adjustment layer 294, for example, can include a P-type work function adjustment layer. The second work function adjustment layer 294, for example, can contain at least one of TiN, TaN, TiC, TiAlC and TaC.

The second impurity epitaxial layer 140 can contain a compressive stress material. For example, the compressive stress material can be a material having a lattice constant greater than Si, and for example, can be SiGe.

The compressive stress material can improve the mobility of carriers in the channel region by applying the compressive stress to the channel region defined in the third active fin 220.

A second field insulating film 120 can be formed on the substrate 100 to cover a part of the side walls of the third active fin 220 and expose the upper portion of the third active fin 220. That is, as illustrated, the second field insulating film 120 can cover the lower portion of the third active fin 220. The second field insulating film 120 and the first field insulating film 110 can contain substantially the same material. That is, in some embodiments, the first field insulating film 110 and the second field insulating film 120 can be formed as one body at a time.

The second field insulating film 120 can be formed at a second height H2. Here, the second height H2 can be lower than the first height H1 of the first field insulating film 110. In other words, the first height H1 of the first field insulating film 110 can be higher than the second height H2 of the second field insulating film 120.

Because the interval L1 between the first and second active fins 210, 212 is different from the interval L2 between third and fourth active fins 220, 230 in the process of forming the first insulating film 110 and the second field insulating film 120 at the same time, the second height H2 of the second field insulating film 120 may be lower than the first height H1 of the first field insulating film 110.

Specifically, because the interval L1 between the first active fin 210 and the second active fin 212 is narrow, the first field insulating film 110 is formed to be relatively high. However, because the interval L2 between the third active pin 220 and the fourth active fin 230 is wide, the second field insulating film 120 can be formed to be relatively low.

Depending on the shapes of the first and second field insulating films 110, 120, the third active fin 220 can project upward from the second field insulating film 120 by a fourth height H4. Here, the fourth height H4 can be higher than the third height H3 of the first and second active fins 210, 212. In other words, the third height H3 of the first and second active fins 210, 212 protruding from the first field insulating films 110 can be smaller than the fourth height H4 of the third active fin 220 protruding from the second field insulating film 120.

Thus, in this embodiment, the channel region of the first and second active fins 210, 212 operated by NFET is smaller than the channel region of the third active fin 220 operated by PFET.

Because electrons are used as carriers in the NFET and holes are used as carriers in the PFET, if the channel regions of the NFET and the PFET are the same, the operating characteristics of the NFET and the PFET may change due to the difference in mobility of the carriers.

However, in this embodiment, by causing the first and second active fins 210, 212 operated by the NFET to slightly protrude from the first field insulating films 110, and by causing the third active fin 220 operated by the PFET to considerably protrude from the second field insulating film 120, it is possible to make a difference in the channel region between the NFET and the PFET.

Thus, because it is possible to maintain the uniform operating characteristics of the NFET and the PFET, the operating characteristics of the semiconductor device can be improved.

Referring to FIG. 4 again, the second pull-up transistor PU2 can be defined in a region in which the third gate electrode 253 intersects with the fourth active fin 230. The second pull-down transistor PD2 can be defined in a region in which the third gate electrode 253 intersects with the fifth and sixth active fins 240, 242.

Because the second pull-up transistor PU2 can have substantially the same configuration as that of the above-described first pull-up transistor PU1 and the second pull-down transistor PD2 can have substantially the same configuration as that of the above-described first pull-down transistor PD1, the description will not be repeated.

As illustrated in FIG. 4, the semiconductor device 1 can include a first region in which, for example, the first and second pull-down transistors PD1, PD2 operated by the NFET are defined, and a second region in which, for example, the first and second pull-up transistors PD1, PD2 operated by the PFET are defined. Moreover, at this time, the interval L1 between the active fins (e.g., 210, 212, 240, 242) disposed in the first region can be smaller than the interval L2 between the active fins (e.g., 220, 230) disposed in the second region. Thus, the active fins (e.g., 210, 212, 240, 242) disposed in the first region can protrude from the field insulating film (e.g., 110) by a relatively small amount, and the active fins (e.g., 220, 230) disposed in the second region can protrude from the field insulating film (e.g., 120) by a relatively large amount.

The first pass transistor PS1 can be defined in a region in which the second gate electrode 252 intersects with the first and second active fins 210, 212. The second pass transistor PS2 can be defined in a region in which the fourth gate electrode 254 intersects with the fifth and sixth active fins 240, 242.

Although it is not clearly illustrated, a large number of contacts 250 can be formed on both sides of the region in which the first through fourth gate electrodes 251 to 254 intersect with the first through sixth active fins 210, 212, 220, 230, 240, 242.

A first shared contact 261 can connect the third active fin 220, the third gate line 253 and the wiring 271 at the same time. A second shared contact 262 can connect the fourth active fin 230, the first gate line 251 and the wiring 272 at the same time.

Figure 8:
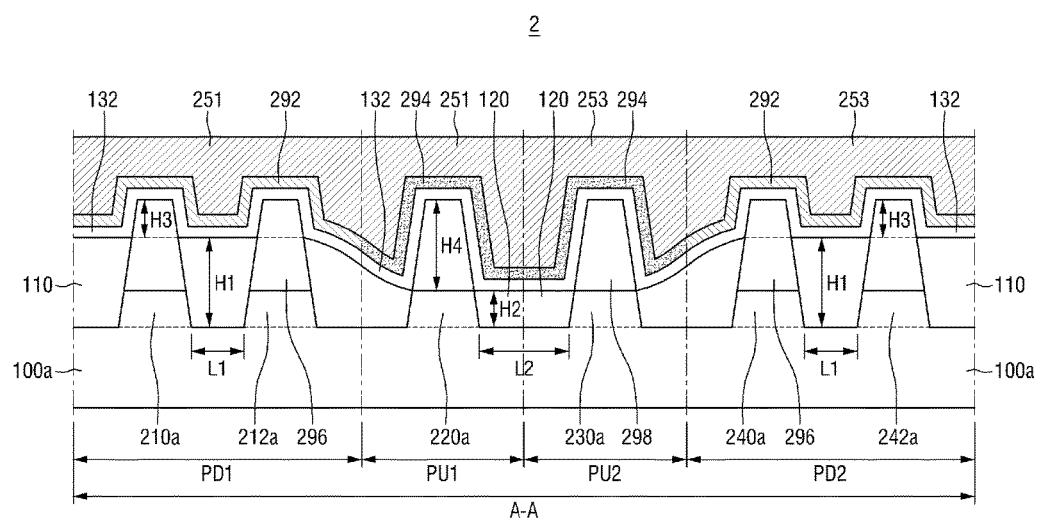
FIG. 8 is a cross-sectional view of a semiconductor device according to another embodiment of the present disclosure.

FIG. 8 is a cross-sectional view of a semiconductor device according to another embodiment of the inventive concept. Differences from the above-described embodiments will be mainly described below.

Referring to FIG. 8, a semiconductor device 2 differs in the substrate and the first through sixth active fins from the above-described embodiment.

Specifically, first active fins 210a, 296 and second active fins 212a, 296 operated by the first pull-down transistor PD1 can include first compound semiconductor layers 210a, 212a and a second compound semiconductor layer 296.

Third active fins 220a, 298 operated by the first pull-up transistor PU1 can include a first compound semiconductor layer 220a and a third compound semiconductor layer 298.

Fourth active fins 230a, 298 operated by the second pull-up transistor PU2 can include a first compound semiconductor layer 230a and a third compound semiconductor layer 298.

Fifth active fins 240a, 296 and sixth active fins 242a, 296 operated by the second pull-down transistor PD2 can include first compound semiconductor layers 240a, 242a, and a second compound semiconductor layer 296.

The substrate 100a can be substantially the same as the first compound semiconductor layers 210a, 212a, 220a, 230a, 240a, 242a. That is to say, the first compound semiconductor layers 210a, 212a, 220a, 230a, 240a, 242a and the substrate 100a can include the same material.

The first compound semiconductor layers 210a, 212a, 220a, 230a, 240a, 242a can be different from the second compound semiconductor layer 296 disposed in the upper regions of the first and second active fins and in the upper regions of the fifth and sixth active fins. Further, the first compound semiconductor layers 210a, 212a, 220a, 230a, 240a, 242a can be different from the third compound semiconductor layer 298 disposed in the upper regions of the third and fourth active fins. Further, the second compound semiconductor layers 296 disposed in the upper regions of the first and second active fins and in the upper regions of the fifth and sixth active fins can be different from the third compound semiconductor layers 298 disposed in the upper regions of the third and fourth active fins.

In some embodiments, the first compound semiconductor layers 210a, 212a, 220a, 230a, 240a, 242a can include the first semiconductor and the second semiconductor at a first ratio, the second compound semiconductor layer 296 can include the first semiconductor and the second semiconductor at a second ratio different from the first ratio, and the third compound semiconductor layer 298 can include the first semiconductor and the second semiconductor at a third ratio different from the first and second ratios.

Also, in some other embodiments, the first compound semiconductor layers 210a, 212a, 220a, 230a, 240a, 242a include the first semiconductor and the second semiconductor at a first ratio, the second compound semiconductor layer 296 includes the first semiconductor but does not include the second semiconductor, and the third compound semiconductor layer 298 can include the first semiconductor and the second semiconductor at a second ratio different from the first ratio.

In some embodiments, the first semiconductor can contain, for example, Si, and the second semiconductor can contain, for example, Ge. In this case, the first compound semiconductor layers 210a, 212a, 220a, 230a, 240a, 242a contain Si and Ge, the second compound semiconductor layer 296 contains Si but does not contain Ge, and the third compound semiconductor layer 298 can have a ratio of Ge higher than Si, as compared to the first compound semiconductor layers 210a, 212a, 220a, 230a, 240a, 242a. However, embodiments of the inventive concept are not limited thereto, and the examples of the first through third compound semiconductor layers 210a, 212a, 220a, 230a, 240a, 242a, 296, 298 can be implemented by being otherwise modified.

Figure 9:
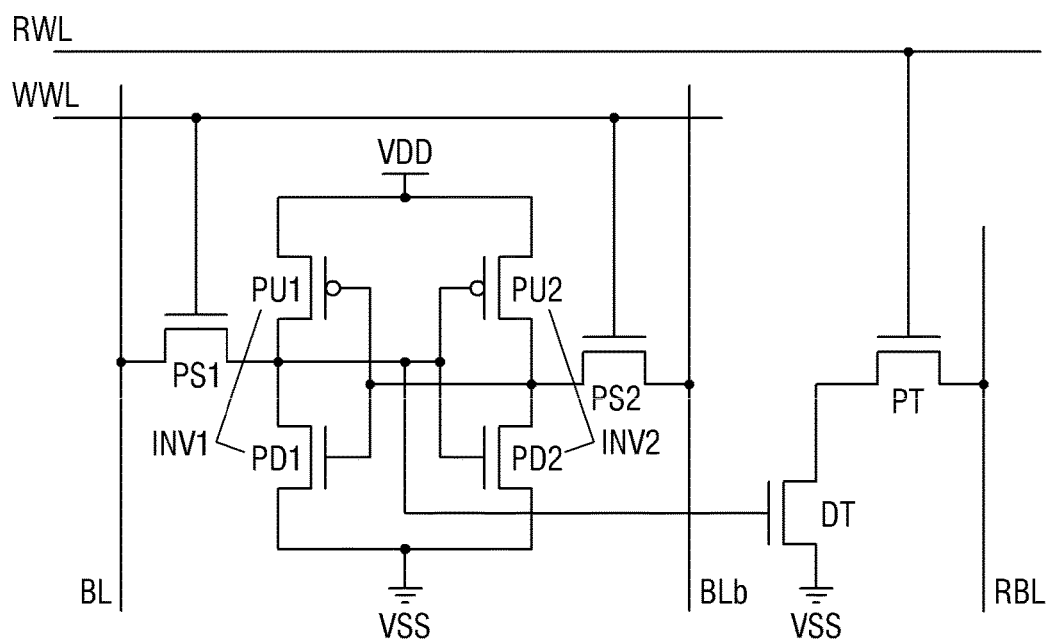
FIG. 9 is a circuit diagram of a semiconductor device according to still another embodiment of the present disclosure.
Figure 10:
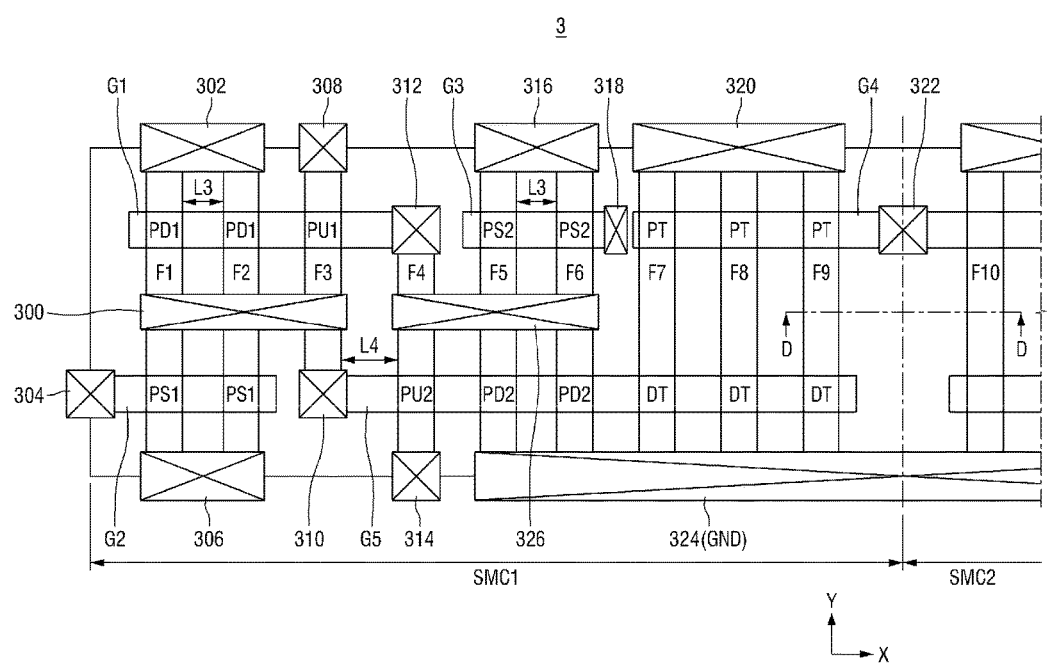
FIG. 10 is a layout diagram of a semiconductor device according to still another embodiment of the present disclosure.

FIG. 9 is a circuit diagram of a semiconductor device according to still another embodiment of the inventive concept. FIG. 10 is a layout diagram of a semiconductor device according to still another embodiment of the inventive concept.

Referring to FIG. 9, each of SRAM memory cell regions (SMC1, SMC2 of FIG. 2) of a semiconductor device 3 can include a SRAM element made up of eight transistors.

That is, each of the SRAM memory cell regions (SMC1, SMC2 of FIG. 2) can include first and second inverters INV1, INV2 connected in parallel between the power supply node VDD and the ground node VSS, a first selection transistor PS1 and a second selection transistor PS2 connected to the output nodes of the respective inverters INV1, INV2, a drive transistor DT controlled by the output of the first inverter INV1, and a pass transistor PT connected to the output node of the drive transistor DT.

The first selection transistor PS1 and the second selection transistor PS2 can be connected to a bit line BL and a complementary bit line BLb, respectively. The gates of the first selection transistor PS1 and the second selection transistor PS2 can be connected to a write word line WWL.

The first inverter INV1 can include a first pull-up transistor PU1 and a first pull-down transistor PD1 connected in series between the power supply node VDD and the ground node VSS, and the second inverter INV2 can include a second pull-up transistor PU2 and a second pull-down transistor PD2 connected in series between the power supply node VDD and the ground node VSS. The first pull-up transistor PU1 and the second pull-up transistor PU2 can be a PFET transistor, and the first pull-down transistor PD1 and the second pull-down transistor PD2 can be an NFET transistor.

Further, the input node of the first inverter INV1 can be connected to the output node of the second inverter INV2 and the input node of the second inverter INV2 can be connected to the output node of the first inverter INV so that the first inverter INV1 and the second inverter INV2 constitute a single latch circuit.

The drive transistor DT and the pass transistor PT can be used to read the data stored in the latch circuit constituted by the first inverter INV1 and the second inverter INV2. The gate of the drive transistor DT can be connected to the output node of the first inverter INV1, and the gate of the pass transistor PT can be connected to a read word line RWL. The output of the drive transistor D1 can be connected to the ground node VSS as illustrated and the output of the pass transistor PT can be connected to the read bit line RBL as illustrated.

By this circuit configuration, in the semiconductor device 3 according to the embodiment, it is possible to perform access to data stored in the SRAM element through two ports (e.g., a double port).

First, by selecting the write word line WWL, the bit line BL and the complementary bit line BLb, it is possible to write the data on the latch circuit constituted by the first inverter INV1 and the second inverter INV2 or to read the data stored in the latch circuit. That is, this path can be used as a first port.

Moreover, by selecting the read word line RWL and the read bit line RBL, it is also possible to read the data stored in the latch circuit constituted by the first inverter INV1 and the second inverter INV2. That is, this path can be used as a second port.

In the SRAM element, the operation of writing the data using the first port and the operation of reading the data using the second port are separately performed. Therefore, it is possible to independently perform the operation of reading the data stored in the latch circuit and the operation of writing the data on the latch circuit.

Next, referring to FIGS. 9 and 10, each SRAM memory cell region (e.g., SMC1) can include nine active fins F1 to F9, five gate electrodes G1 to G5, and a plurality of contacts 300, 302, 304, 306, 308, 310, 312, 314, 316, 318, 320, 322, 324, 326.

The first though ninth active fins F1 to F9 can be disposed in a shape extending in the second direction Y.

The first gate electrode G1 overlaps the first through third active fins F1 to F3 and can be disposed in a shape extending in the first direction X. The first pull-down transistor PD1 is defined in the region in which the first and second active fins F1, F2 intersect with the first gate electrode G1, and the first pull-up transistor PU1 can be formed in a region in which the third active fin F3 intersects with the first gate electrode G1.

The source of the first pull-down transistor PD1 can be connected to a second contact 302. Here, the second contact 302 can be connected to the ground node VSS. The source of the first pull-up transistor PU1 can be connected to a fifth contact 308. Here, the fifth contact 308 can be connected to the power supply node VDD. The drain of the first pull-down transistor PD1 and the drain of the first pull-up transistor PU1 can be connected to the first contact 300. That is, the first pull-down transistor PD1 and the first pull-up transistor PU1 can share the first contact 300.

The first active fin F1 and the second active fin F2 can be disposed so as to be spaced apart from each other by a third interval L3. Here, the third interval L3 can be different from a fourth interval L4, which will be described below. Specifically, the third interval L3 can be smaller than the fourth interval L4.

Meanwhile, a first selection transistor PS1 can be formed in a region in which the first and second active fins F1, F2 intersect with the second gate electrode G2. The drain of the first selection transistor PS1 can be connected to the first contact 300. That is, the first pull-down transistor PD1, the first pull-up transistor PU1 and the first selection transistor PS1 can share the first contact 300. The source of the first selection transistor PS1 can be connected to a fourth contact 306. Moreover, the fourth contact 306 can be connected to the bit line BL. Meanwhile, the second gate electrode G2 can be connected to the third contact 304. The third contact 304 can be connected to the write word line WWL.

Here, the first pull-down transistor PD1 and the first selection transistor PS1 can be formed using the two active fins F1, F2, and the first pull-up transistor PU1 can be formed using one active pin F3. Therefore, the sizes of the first pull-down transistor PD1 and the first selection transistor PS1 can be greater than that of the first pull-up transistor PU1.

A sixth contact 310 can be connected to the first contact 300 through the third active fin F3. The sixth contact 310 can be connected to the fifth gate electrode G5. The fifth gate electrode G5 can be disposed to intersect the fourth through ninth active fins F4 to F9 and in a shape of extending in the first direction X.

A second pull-up transistor PU2 can be defined in a region in which the fourth active fin F4 and the fifth gate electrode G5 intersect with each other, a second pull-down transistor PD2 can be defined in a region in which the fifth and sixth active fin F5, F6 intersect with the fifth gate electrode G5, and a drive transistor DT can be defined in a region in which the seventh through ninth active fins F7 to F9 intersect with the fifth gate electrode G5.

The fifth active fin F5 and the sixth active fin F6 can be disposed so as to be spaced apart from each other by a third interval L3. Here, the third interval L3 can be different from a fourth interval L4 which will be described below. Specifically, the third interval L3 can be smaller than the fourth interval L4.

Because the first contact 300 is connected to the fifth gate electrode G5 through the third active fin F3 and the sixth contact 310 in advance, the outputs of the first pull-up transistor PU1, the first pull-down transistor PD1 and the first selection transistor PS1 can be applied to the gates of the second pull-up transistor PU2, the second pull-down transistor PD2 and the drive transistor DT.

The drain of the second pull-up transistor PU2 and the drain of the second pull-down transistor PD2 can be connected to a seventh contact 312 and a fourteenth contact 326. The seventh contact 312 can be connected to the first gate electrode G1. Therefore, the output of the second pull-up transistor PU2 and the output of the second pull-down transistor PD2 can be applied to the gates of the first pull-up transistor PU1 and the first pull-down transistor PD1.

The source of the second pull-up transistor PU2 can be connected to an eighth contact 314. The eighth contact 314 can be connected to the power supply node VDD. The source of the second pull-down transistor PD2 and the source of the drive transistor DT can be connected to a thirteenth contact 324. Moreover, the thirteenth contact 324 can be connected to the ground node VSS.

The third active fin F3 and the fourth active fin F4 can be disposed so as to be spaced apart from each other by the fourth interval L4. Here, the fourth interval L4 can be different from the above-described third interval L3. Specifically, the fourth interval L4 can be greater than the third interval L3. Thus, the third and fourth active fins F3, F4 included in the first and second pull-down transistors PD1, PD2 serving as NFET can be formed to further protrude from the field insulating film, as compared to the first and second active fins F1, F2 and the fifth and sixth active fins F5, F6 included in the first and second pull-up transistors PU1, PU2 serving as PFET. Therefore, the ratio of the channel region in the third and fourth active fins F3, F4 is greater than the ratio of the channel region in the first and second active fins F1, F2 and the fifth and sixth active fins F5, F6, and thus, the operating characteristics of the first and second pull-up transistors PU1, PU2 and the first and second pull-down transistors PD1, PD2 can be improved together.

A second selection transistor PS2 can be formed in a region in which the fifth and sixth active fins F5, F6 intersect with the third gate electrode G3, and a pass transistor PT can be formed in a region in which the seventh through ninth active fins F7 to F9 intersect with the fourth gate electrode G4.

The source of the second selection transistor PS2 can be connected to a ninth contact 316. The ninth contact 316 can be connected to the complementary bit line BLb. The drain of the second selection transistor PS2 can be connected to the fourteenth contact 326. Because the fourteenth contact 326 is connected to the seventh contact 312 through the fourth active fin F4 in advance, the output of the second selection transistor PS2 can be applied to the gates of the first pull-up transistor PU1 and the first pull-down transistor PD1. Meanwhile, as illustrated, the third gate electrode G3 can be connected to a tenth contact 318. The tenth contact 318 can be connected to the write word line WWL. In other words, the tenth contact 318 and the fourth contact 306 can be electrically connected to each other.

The source of the pass transistor PT can be connected to an eleventh contact 320. The eleventh contact 320 can be connected to the read bit line RBL. The drain of the pass transistor PT can be connected to the drain of the drive transistor DT.

The fourth gate electrode G4 can be connected to a twelfth contact 322. The twelfth contact 322 can be connected to the read word line RWL.

In this embodiment, the SRAM memory cell region SMC1 and the SRAM memory cell region SMC2 can share the twelfth contact 322 and the thirteenth contact 324. However, embodiments of the inventive concept are not limited thereto, and this can be implemented by being modified in various ways. For example, in some other embodiments, each of the SRAM memory cell region SMC1 and the SRAM memory cell region SMC2 may be connected to each of the write word line RWL and the ground node VSS via another contact, without sharing the contact with each other.

Meanwhile, the drive transistor DT and the pass transistor PT can be formed using three active fins F7 to F9, the second pull-down transistor PD2 and the second selection transistor PS2 can be formed using the two active fins F5, F6, and the second pull-up transistor PU2 can be formed using one active fin F4. Therefore, the sizes of the drive transistor DT and the pass transistor PT can be greater than the sizes of the second pull-down transistor PD2 and the second selection transistor PS2, and the sizes of the second pull-down transistor PD2 and the second selection transistor PS2 can be greater than the size of the second pull-up transistor PU2. In other words, the size of the transistor disposed at a boundary between the SRAM memory cell region SMC1 and the SRAM memory cell region SMC2 can be greater than the size of the transistor that is far away from the boundary between the SRAM memory cell region SMC1 and the SRAM memory cell region SMC2.

Figure 11:
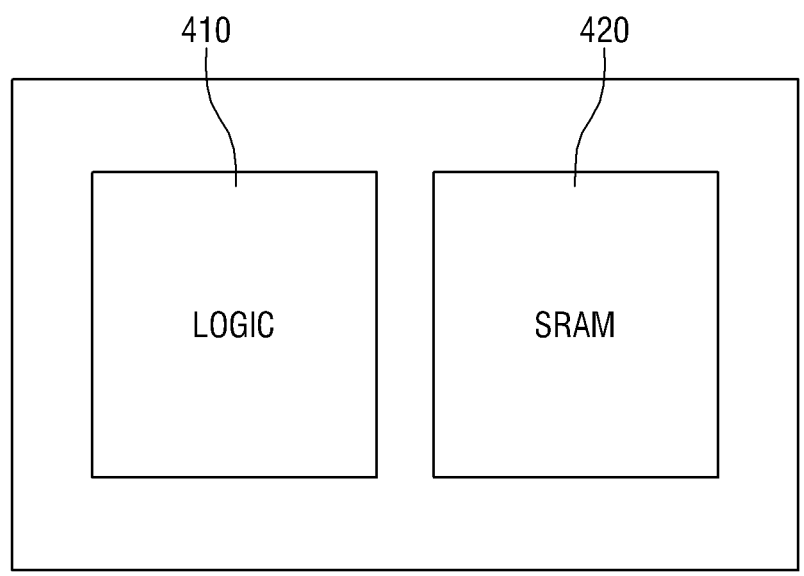
FIG. 11 is a conceptual view of a semiconductor device according to still another embodiment of the present disclosure.

FIG. 11 is a conceptual view of a semiconductor device according to still another embodiment of the inventive concept. Differences from the above-described embodiments will be mainly described below.

Referring to FIG. 11, a semiconductor device 4 according to the embodiment can include a logic region 410 and a SRAM forming region 420. A logic element used for the operation of the semiconductor device 4 is formed in the logic region 410, and a SRAM element can be formed in the SRAM forming region 420.

In some embodiments of the inventive concept, any one of the semiconductor devices according to the above-described embodiments of the inventive concept can be disposed in the SRAM forming region 420. Also, in some other embodiments of the inventive concept, any of the semiconductor devices according to the above-described embodiments of the inventive concept can be disposed in combination with each other in the SRAM-forming region 420.

FIG. 11 illustrates the exemplary logic region 410 and SRAM forming region 420, but is not limited thereto. For example, embodiments of the inventive concept are also applicable to a region (e.g., DRAM, MRAM, RRAM, PRAM, etc.) in which a memory other than the logic region 410 is formed.

Figure 12:
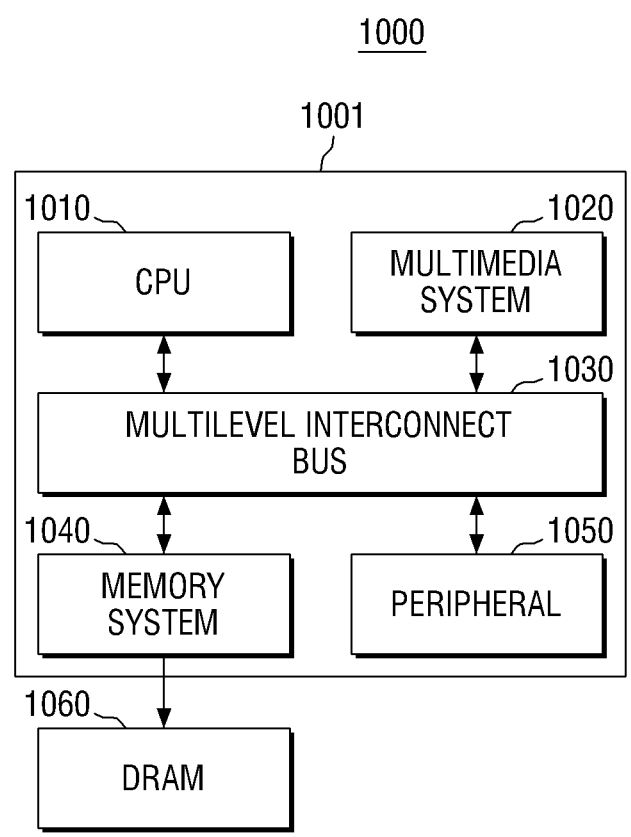
FIG. 12 is a block diagram of a SoC system including a semiconductor device according to embodiments of the present disclosure.

FIG. 12 is a block diagram of a SoC system including the semiconductor devices according to some embodiments of the inventive concept.

Referring to FIG. 12, the SoC system 1000 includes an application processor 1001 and a DRAM 1060.

The application processor 1001 can include a central processing unit 1010, a multi-media system 1020, a multi-level connection bus 1030, a memory system 1040 and a peripheral circuit 1050.

The central processing unit 1010 can perform the calculation required for driving of the SoC system 1000. In some embodiments of the inventive concept, the central processing unit 1010 can be configured as a multi-core environment that includes a plurality of cores.

In an embodiment, the central processing unit 1010, for example, can include a cache memory including the SRAM. The cache memory can include a L1 cache memory, a L2 cache memory and the like. The semiconductor devices according to the above-described embodiments of the inventive concept, for example, can be adopted as the components of the cache memory.

The multi-media system 1020 can be used to perform various multi-media functions in the SoC system 1000. The multi-media system 1020 can include a 3D engine module, a video codec, a display system, a camera system, a post-processor and the like.

The multi-level connection bus 1030 can be used to perform the mutual data communication of the central processing unit 1010, the multi-media system 1020, the memory system 1040, and the peripheral circuit 1050. In some embodiments of the inventive concept, the multi-level connection bus 1030 can have a multi-layer structure. Specifically, as examples of the multi-level connection bus 1030, a multi-layer AHB (multi-layer Advanced High-performance Bus) or a multi-layer AXI (multi-layer Advanced eXtensible Interface) can be used, but embodiments of the inventive concept are not limited thereto.

The memory system 1040 can provide an environment in which the application processor 1001 is connected an external memory (e.g., DRAM 1060) to perform the high-speed operation. In some embodiments of the inventive concept, the memory system 1040 may include another controller (e.g., DRAM controller) for controlling the external memory (e.g., DRAM 1060).

The peripheral circuits 1050 can provide an environment in which the SoC system 1000 is smoothly connected to an external device (e.g., a main board). Thus, the peripheral circuits 1050 can be provided with various interfaces that make the external device connected to the SoC system 1000 compatible.

The DRAM 1060 can function as an operation memory required for operating the application processor 1001. In some embodiments of the inventive concept, as illustrated, the DRAM 1060 can be disposed outside the application processor 1001. Specifically, the DRAM 1060 can be packaged in the form of PoP (Package on Package) together with the application processor 1001.

At least one of the components of the SoC system 1000 can include at least one of the semiconductor devices according to the above-described embodiments of the inventive concept.

Figure 13:
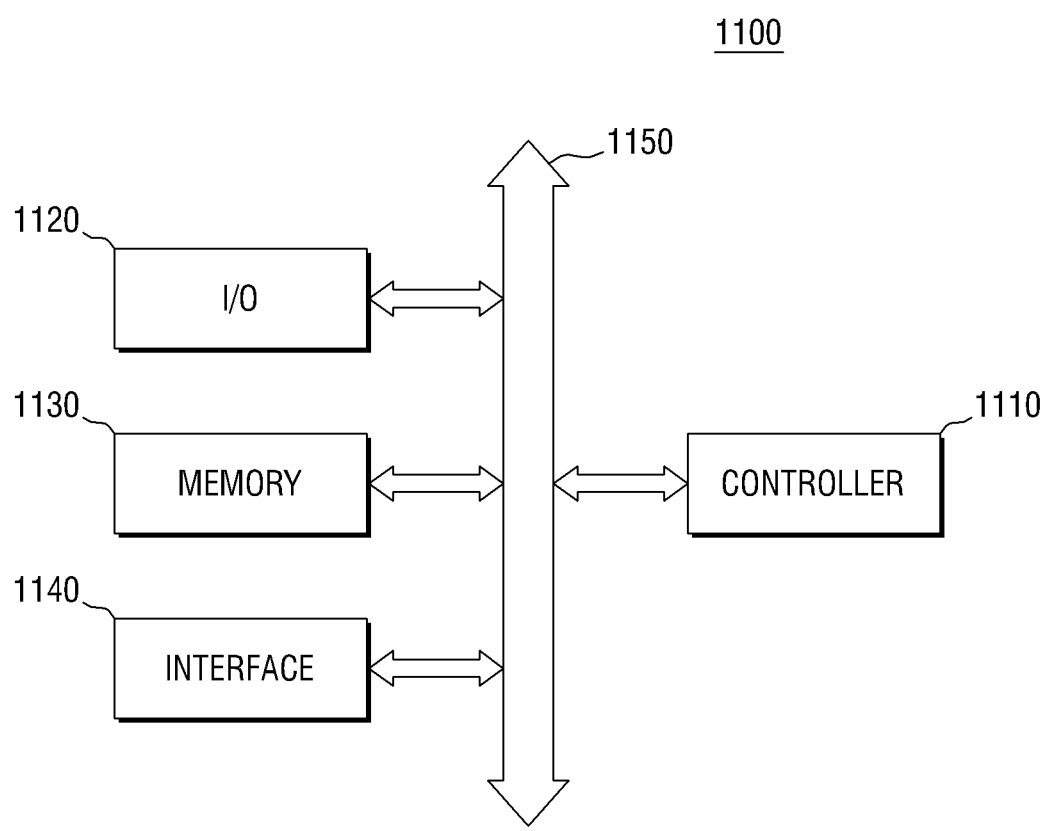
FIG. 13 is a block diagram of an electronic system including a semiconductor device according to embodiments of the present disclosure.

FIG. 13 is a block diagram of an electronic system including semiconductor devices according to embodiments of the inventive concept.

Referring to FIG. 13, the electronic system according to an embodiment of the inventive concept can include a controller 1110, an input/output device (I/O) 1120, a memory device 1130, an interface 1140 and a bus 1150. The controller 1110, the input/output device 1120, the memory device 1130 and/or the interface 1140 can be coupled together via the bus 1150. The bus 1150 corresponds to a path in which the data are moved.

The controller 1110 can include at least one of a microprocessor, a digital signal processor, a microcontroller, and logic elements capable of performing functions similar to these elements. The input/output device 1120 can include a keypad, a keyboard, a display device and the like. The memory device 1130 can store data and/or instruction words. The interface 1140 can perform the functions of transferring the data to the communication network or receiving the data from the communication network. The interface 1140 can be in a wired or wireless form. For example, the interface 1140 can include an antenna or a wired and wireless transceiver.

Although it is not illustrated, the electronic system 1100 can further include a high-speed DRAM and/or SDRAM as an operation memory for improving the operation of the controller 1110. For example, when the electronic system 1100 includes a high-speed SRAM, the semiconductor device according to the above-described embodiments of the inventive concept can be used in such a high-speed SRAM.

The semiconductor devices according to the above-mentioned embodiments of the inventive concept can be provided inside the memory device 1130 or can be provided as a part of the controller 1110, the input/output device (I/O) 1120 or the like.

The electronic system 1100 can be applied to a personal digital assistant (PDA), a portable computer, a web tablet, a wireless phone, a mobile phone, a digital music player, a memory card or all electronic products that can transmit and/or receive information in a wireless environment.

Figure 14:
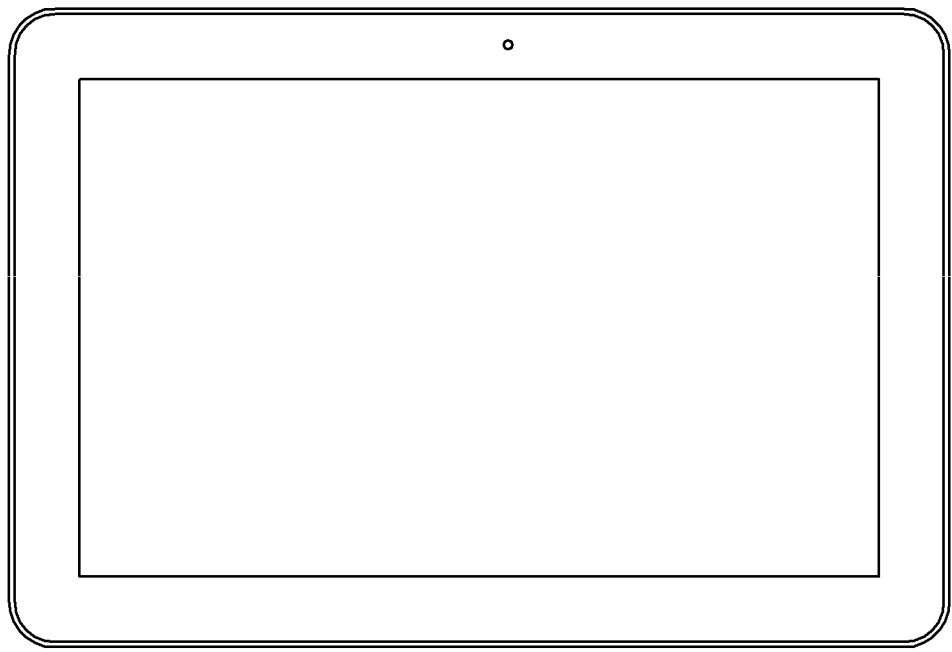
FIGS. 14 to 16 are exemplary semiconductor systems to which semiconductor devices according to embodiments of the present disclosure are applicable.
Figure 15:
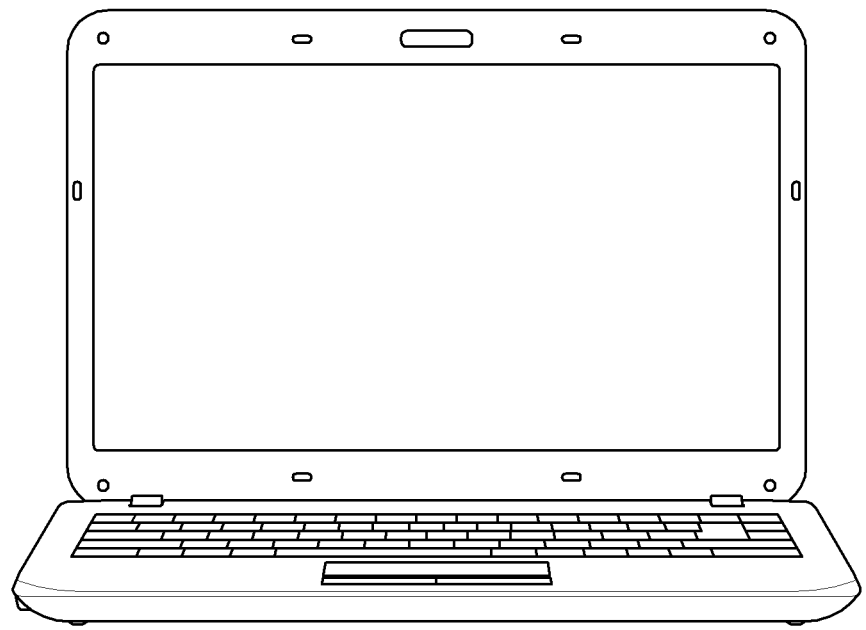
Figure 16:
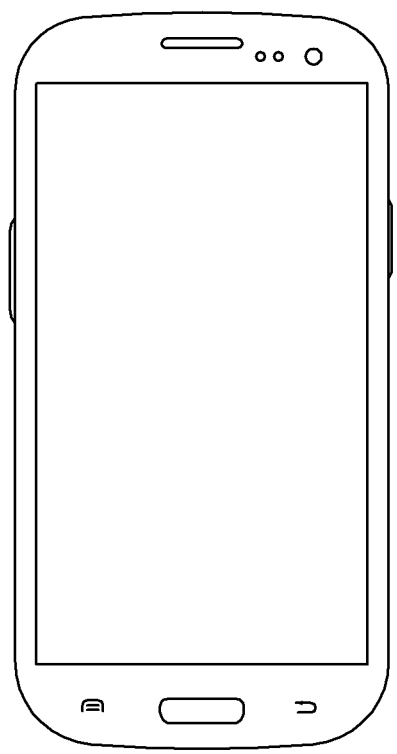

FIGS. 14 to 16 illustrate exemplary semiconductor systems to which the semiconductor devices according to the embodiments of the inventive concept are applicable.

FIG. 14 is a diagram illustrating a tablet PC 1200, FIG. 15 is a diagram illustrating a laptop computer 1300, and FIG. 16 is a diagram illustrating a smart phone 1400. The semiconductor devices according to the above-described embodiments of the inventive concept can be used in the tablet PC 1200, the laptop computer 1300, the smart phone 1400 or the like.

Further, it will be apparent to those skilled in the art that the semiconductor devices according to the above-described embodiments of the inventive concept are also applicable to other integrated circuit devices that are not illustrated.

That is, although only the tablet PC 1200, the laptop computer 1300 and the smart phone 1400 are illustrated as examples of the semiconductor systems according to the above-described embodiments, embodiments of semiconductor systems according to the inventive concept are not limited thereto.

In some embodiments of the inventive concept, the semiconductor system may be implemented by a computer, an ultra mobile PC (UMPC), a workstation, a net-book, personal digital assistants (PDA), a portable computer, a wireless phone, a mobile phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player or the like.

FIGS. 17 to 20 are intermediate stage diagrams for illustrating a method of manufacturing a semiconductor device according to an embodiment of the inventive concept.

Figure 17:
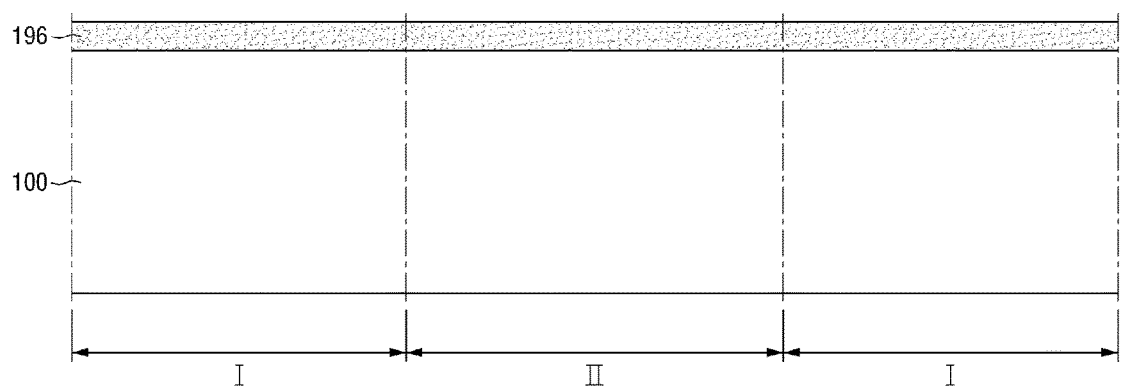
FIGS. 17 to 20 are intermediate stage diagrams illustrating a method of manufacturing a semiconductor device according to an embodiment of the present disclosure.

Referring to FIG. 17, there is provided a substrate 100 including a first region I and a second region II. The first region I, for example, can be a region in which an N-type semiconductor element is formed, and the second region II, for example, can be a region in which a P-type semiconductor element is formed, but embodiments of the inventive concept are not limited thereto.

The substrate 100 can include a semiconductor material. The semiconductor material, for example, can be made of one or more materials selected from the group consisting of Si, Ge, SiGe, GaP, GaAs, SiC, SiGeC, InAs and InP.

However, embodiments of the inventive concept are not limited to these examples, and in some other embodiments, the substrate 100 may be an insulating substrate. That is, the substrate 100, for example, can be a SOI (silicon on insulator) substrate. Thus, if the substrate 100 is a SOI, the response speed of the semiconductor device can be improved.

Subsequently, a mask film 196 is formed on a substrate 100.

The mask film 196, for example, can include a silicon nitride film, but embodiments of the inventive concept are not limited thereto.

Figure 18:
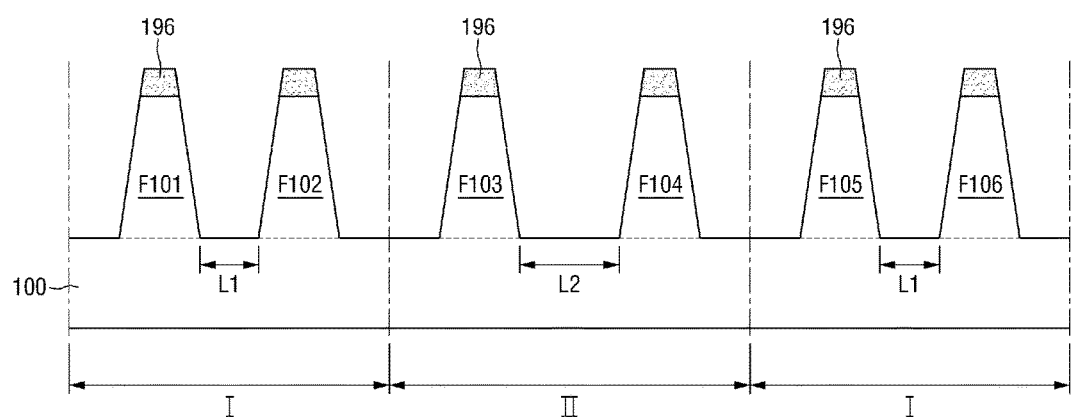

With reference to FIG. 18, the mask film 196 and the substrate 100 are etched to form the first through sixth active fins F101 to F106. Although the cross-sectional shapes of the first through sixth active fins F101 to F106 are illustrated as a trapezoidal shape in FIG. 18, embodiments of the inventive concept are not limited thereto.

When forming the first through sixth active fins F101 to F106, it is possible to form the first and second active fins F101, F102 and the fifth and sixth active fins F105, F106 in the first region I at the first interval L1, and it is possible to form the third and fourth active fins F103, F104 in the second region II at the second interval L2 greater than the first interval L1. That is, the active fins F101, F102, F105, F106 can be formed at the narrow interval L1 in the first region as a region in which the N-type semiconductor element is formed, and the active fins F105, F106 can be formed at the wide interval L2 in the second region II as a region in which the P-type semiconductor element is formed.

Figure 19:
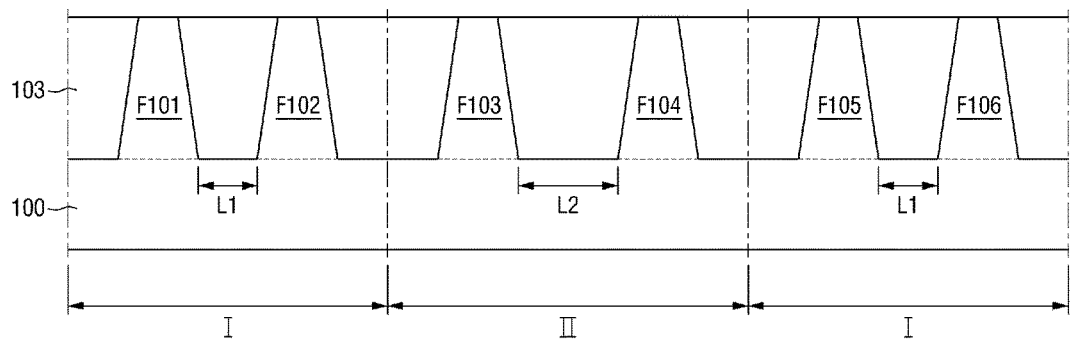

Next, with reference to FIG. 19, the field insulating film 103 is formed on the substrate 100. Subsequently, the field insulating film 103 is flattened until the mask film 196 is removed. The field insulating film 103, for example, can include a silicon oxide film, a silicon nitride film, a silicon oxynitride film and the like.

Figure 20:
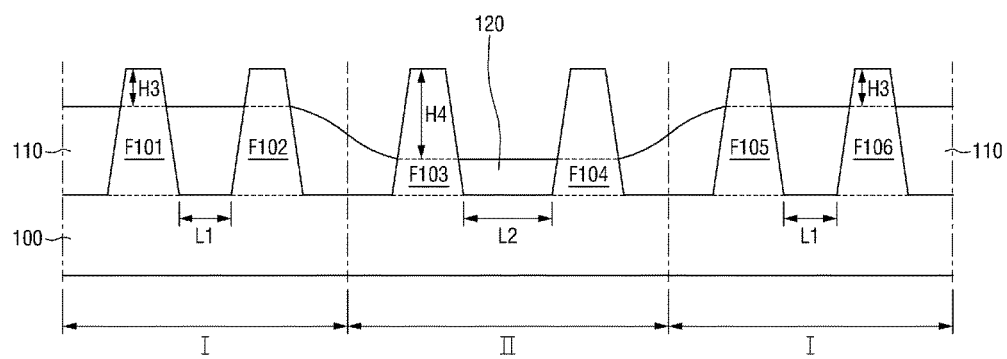

Next, referring to FIG. 20, the field insulating film (103 of FIG. 19) is etched so that the upper surface of the field insulating film than (103 of FIG. 19) becomes lower than the upper surfaces of the active fins F101 to F106. At this time, because the interval L2 between the third and fourth active fins F103, F104 formed in the second region II is wider than the interval L1 between the first and second active pins F101, F102 and between the fifth and sixth active fins F105, F106 formed in the first region I, the height of the upper surface of the field insulating film (103 of FIG. 19) may change by the loading effect.

Specifically, the field insulating film (103 of FIG. 19) is slightly etched in the first region I so that the first field insulating films 110 can be formed, and the field insulating films (103 of FIG. 19) is significantly etched in the second region II so that the second field insulating film 120 can be formed. Thus, the first and second active fins F101, F102 and the fifth and sixth active fins F105, F106 formed in the first region I can protrude from the first field insulating films 110 by the third height H3, and the third and fourth active fins F103, F104 formed in the second region II can protrude from the second field insulating film 120 by the fourth height H4 higher than the third height H3.

In some embodiments, the first region I can be an NFET region in which the pull-down transistor of the SRAM is formed and the second region II can be a PFET region in which the pull-up transistor of the SRAM is formed, but embodiments of the inventive concept are not limited thereto.

Figure 21:
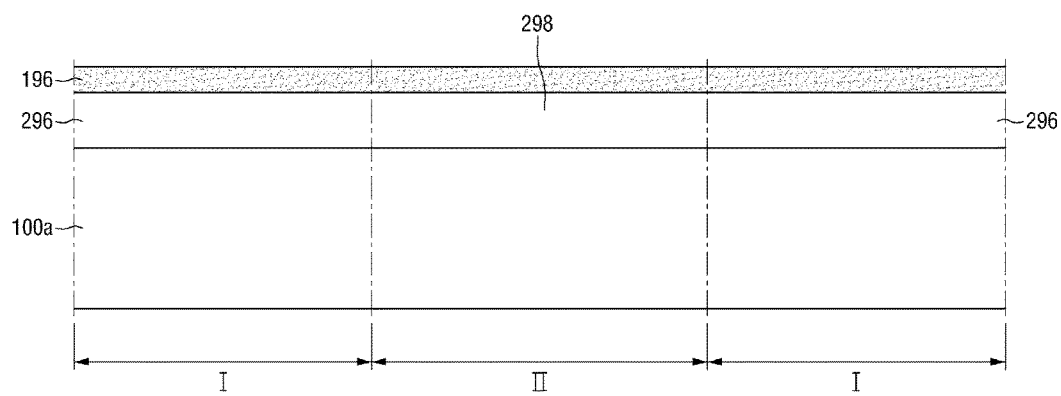
FIGS. 21 and 22 are intermediate stage diagrams illustrating a method of manufacturing a semiconductor device according to another embodiment of the present disclosure.
Figure 22:
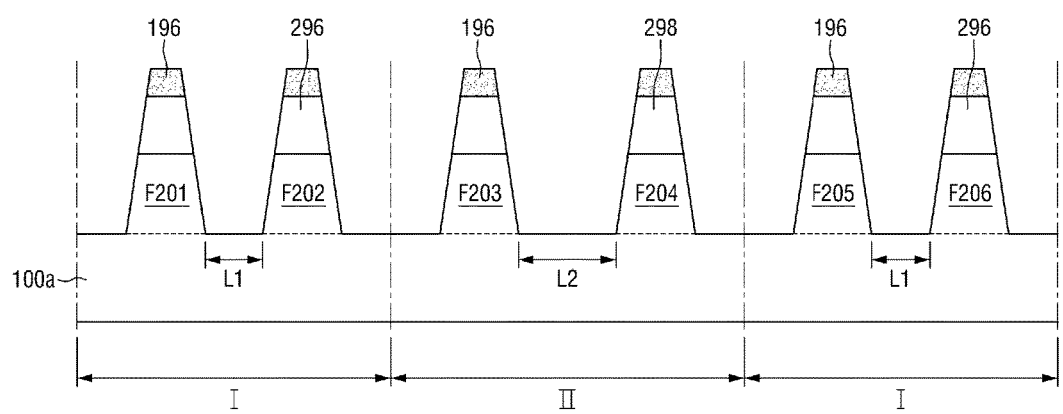

FIGS. 21 and 22 are intermediate stage diagrams illustrating a method of manufacturing a semiconductor device according to another embodiment of the inventive concept. Differences from the above-described embodiments will be mainly described below.

Referring to FIG. 21, there is provided a first compound semiconductor layer 100a, which includes a first region I and a second region II. Here, the first region I, for example, can be a region in which the N-type semiconductor element is formed and the second region II, for example, can be a region in which the P-type semiconductor element is formed, but embodiments of the inventive concept are not limited thereto.

The first compound semiconductor layer 100a, for example, can contain SiGe, but embodiments of the inventive concept are not limited to this example.

Subsequently, a second compound semiconductor layer 296 is formed on the first region I, and a third compound semiconductor layer 298 is formed on the second region II.

In some embodiments, the second compound semiconductor layer 296 can include the first compound semiconductor layer 100a and the semiconductor material at a different ratio. Further, the third compound semiconductor layer 298 can include the first and second compound semiconductor layers 100a, 296 and the semiconductor material at a different ratio.

For example, when the first compound semiconductor layer 100a contains SiGe, the second compound semiconductor layer 296 contains Si but does not contain Ge, and third compound semiconductor layer 298 can have a ratio of Ge higher than Si, as compared to the first compound semiconductor layer 100a. However, embodiments of the inventive concept are not limited thereto, and this can be implemented by being modified in various ways.

Subsequently, a mask film 196 is formed on the substrate 100. The mask film 196, for example, can include a silicon nitride film, but embodiments of the inventive concept are not limited thereto.

Next, with reference to FIG. 22, the mask film 196 and the first through third compound semiconductor layers 100a, 296, 298 are etched to form the first through sixth active fins F201 to F206.

When forming the first through sixth active fins F201 to F206, the first and second active fins F201, F202 and the fifth and sixth active fins F205, F126 can be formed in the first region I at the first interval L1, and the third and fourth active fins F203, F204 can be formed in the second region II at the second interval L2 greater than the first interval L1. That is, in the first region I as a region in which the N-type semiconductor element is formed, the active fins F201, F202, F205, F206 can be formed at the narrow interval L1, and in the second region II as a region in which the P-type semiconductor element is formed, the active fins F205, F206 can be formed at the wide interval L2.

At this time, the active fins F201, F202, F205, F206 formed in the first region I can include a lower region including the first compound semiconductor layer 100a, and an upper region including the second compound semiconductor layer 296. Moreover, the active fins F203, F204 formed in the second region II can include a lower region including the first compound semiconductor layer 100a, and an upper region including the third compound semiconductor layer 298.

Thereafter, because a process of forming the field insulating film (103 of FIG. 19) on the first compound semiconductor layer 100a to form the first field insulating film (110 of FIG. 20) and the second field insulating film (120 of FIG. 20) having the different heights from each other has been fully described above, the repeated description will not be provided.

In concluding the detailed description, those skilled in the art will appreciate that many variations and modifications can be made to the preferred embodiments without substantially departing from the principles of the present disclosure. Therefore, the disclosed embodiments of the disclosure are used in a generic and descriptive sense only and not for purposes of limitation.

What is claimed is:

1. A semiconductor device comprising:
   a substrate;
   first through fourth active fins on the substrate, which extend alongside one another in a first direction; and
   a field insulating film that covers lower portions of the first through fourth active fins;
   wherein the first and second active fins protrude from the field insulating film at a first height,
   wherein the third active fin protrudes from the field insulating film at a second height different from the first height,
   wherein an interval between the first and second active fins is different from an interval between the third and fourth active fins;
   wherein a top surface of the field insulating film has a sloped portion between the second active fin and the third active fin;
   wherein lengths in the first direction of the third and fourth active fins are different from lengths in the first direction of the first and second active fins;
   wherein the first, second, third, and fourth active fins are substantially parallel with each other throughout the lengths of the first, second, third, and fourth active fins;
   wherein the first active fin, the second active fin, the third active fin, and the fourth active fin are spaced apart from each other in a second direction that intersects with the first direction;
   wherein the first and second active fins comprise a first compound semiconductor layer and a second compound semiconductor layer, respectively, and
   wherein the third and fourth active fins comprise the first compound semiconductor layer and a third compound semiconductor layer, respectively, the field insulating film exposes a part of the side surface of the second compound semiconductor layer and completely exposes the side surface of the third compound semiconductor layer.

2. The semiconductor device of claim 1, wherein the first height is lower than the second height.

3. The semiconductor device of claim 1, further comprising:
   a first gate electrode, which extends in the second direction and intersects the first through fourth active fins;
   a second gate electrode, which extends in the second direction to intersect the third and fourth active fins, does not intersect the first and second active fins, and is spaced apart from the first gate electrode in the first direction.

4. The semiconductor device of claim 3, wherein the first and second active fins intersect the first gate electrode to define a first transistor,
   the third active fin intersects the first gate electrode to define a second transistor, and
   the fourth active fin intersects the second gate electrode to define a third transistor.

5. The semiconductor device of claim 4, wherein a conductivity type of the first transistor is different from a conductivity type of the second and third transistors.

6. The semiconductor device of claim 5, wherein the conductivity type of the first transistor is an N-type, and the conductivity type of the second and third transistors is a P-type.

7. The semiconductor device of claim 3, further comprising:
   fifth and sixth active fins, which extend alongside the first through fourth active fins in the first direction,
   wherein the second gate electrode intersects the fifth and sixth active fins.

8. The semiconductor device of claim 7, wherein an interval between the fifth and sixth active fins is different from an interval between the third and fourth active fins.

9. The semiconductor device of claim 7, further comprising:
   an impurity epitaxial layer formed on the first through sixth active fins,
   wherein a conductivity type of the impurity epitaxial layer formed on the first and second active fins and the fifth and sixth active fins is different from a conductivity type of the impurity epitaxial layer formed on the third and fourth active fins.

10. The semiconductor device of claim 3, further comprising:
    a memory cell array region; and
    a peripheral region,
    wherein the memory cell array region comprises a plurality of memory cell regions, and
    each of the memory cell regions comprises the first through fourth active fins, and the first and second gate electrodes.

11. A semiconductor device comprising:
    a substrate;
    first and second active fins on the substrate;
    a first node configured to receive a first voltage;
    a second node configured to receive a second voltage different from the first voltage; and
    a pull-up transistor and a pull-down transistor, which are connected in series between the first node and the second node,
    wherein the pull-down transistor comprises the first active fin, which protrudes from a field insulating film at a first height and extends in a first direction, and a first gate electrode, which extends in a second direction intersecting with the first direction and is disposed on the first active fin, and
    wherein the pull-up transistor comprises the second active fin, which protrudes from the field insulating film at a second height different from the first height and extends in the first direction, and a second gate electrode, which extends in the second direction and is disposed on the second active fin;
    wherein a top surface of the field insulating film has a sloped portion between the first active fin and the second active fin;
    wherein a length in the first direction of the first active fin is different from a length in the first direction of the second active fin; wherein the first and second active fins are substantially parallel with each other throughout the lengths of the first and second active fins;
    wherein the first active fin and the second active fin are spaced apart from each other in the second direction, wherein the first active fins comprise a first compound semiconductor layer and a second compound semiconductor layer, respectively, the second active fins comprise the first compound semiconductor layer and a third compound semiconductor layer, respectively, and wherein the field insulating film exposes a part of the side surface of the second compound semiconductor layer and completely exposes the side surface of the third compound semiconductor layer.

12. The semiconductor device of claim 11, wherein the first height is lower than the second height.

13. The semiconductor device of claim 11, wherein the second active fin and the first active fin are disposed so as to be separated from each other, and the first gate electrode extends to the second gate electrode.

14. The semiconductor device of claim 13, wherein the first active fin comprises third and fourth active fins that are separated from each other to extend alongside each other in the first direction.

15. The semiconductor device of claim 11, wherein the first active fin comprises third and fourth active fins that extend alongside each other in the first direction, the second active fin comprises fifth and sixth active fins that extend alongside each other in the first direction, and an interval between the third and fourth active fins is different from an interval between the fifth and sixth active fins.

16. The semiconductor device of claim 15, wherein the interval between the third and fourth active fins is smaller than the interval between the fifth and sixth active fins.

17. A semiconductor device comprising:
a substrate comprising a first region and a second region;
first and second active fins that extend alongside each other in a first direction in the first region;
third and fourth active fins that extend alongside each other in the first direction in the second region;
a field insulating film that covers lower portions of the first through fourth active fins; and
a gate electrode that extends in a second direction intersecting with the first direction,
wherein the first and second active fins comprise a first compound semiconductor layer, and a second compound semiconductor layer that is disposed on the first compound semiconductor layer and is different from the first compound semiconductor layer,
wherein the third and fourth active fins comprise the first compound semiconductor layer, and a third compound semiconductor layer that is disposed on the first compound semiconductor layer and is different from the first and second compound semiconductor layers, and
wherein a first height of the first and second active fins protruding from the field insulating film is different from a second height of the third and fourth active fins protruding from the field insulating film;
wherein a top surface of the field insulating film has a sloped portion between the second active fin and the third active fin;
wherein lengths in the first direction of the third and fourth active fins are different from lengths in the first direction of the first and second active fins;
wherein the first, second, third, and fourth active fins are substantially parallel with each other throughout the lengths of the first, second, third, and fourth active fins
wherein the first active fin, the second active fin, the third active fin, and the fourth active fin are spaced apart from each other in the second direction,
wherein the first and second active fins comprise a first compound semiconductor layer and a second compound semiconductor layer, respectively,
wherein-the third and fourth active ins comprise the first compound semiconductor layer and a third compound semiconductor layer, respectively, and
wherein the field insulating film exposes a part of the side surface of the second compound semiconductor layer and completely exposes the side surface of the third compound semiconductor layer.

18. The semiconductor device of claim 17, wherein the first compound semiconductor layer comprises a first semiconductor and a second semiconductor at a first ratio, the second compound semiconductor layer comprises the first semiconductor and the second semiconductor at a second ratio different from the first ratio, and the third compound semiconductor layer comprises the first semiconductor and the second semiconductor at a third ratio different from the first and second ratios.

19. The semiconductor device of claim 17, further comprising:
a first conductive impurity epitaxial layer formed on the first and second active fins and having a first conductivity type; and
a second conductive impurity epitaxial layer formed on the third and fourth active fins and having a second conductivity type that is different from the first conductivity type.

* * * * *